US008690065B2

(12) United States Patent
Pelgrom et al.

(10) Patent No.: US 8,690,065 B2
(45) Date of Patent: Apr. 8, 2014

(54) SECURE STORAGE OF A CODEWORD WITHIN AN INTEGRATED CIRCUIT

(75) Inventors: Marcel Pelgrom, Helmond (NL); Maarten Vertregt, Pauwlaan (NL); Hans Paul Tuinhout, Heeze (NL)

(73) Assignee: NXP B.V., Eindhoven (NL)

( * ) Notice: Subject to any disclaimer, the term of this patent is extended or adjusted under 35 U.S.C. 154(b) by 921 days.

(21) Appl. No.: 12/673,458

(22) PCT Filed: Aug. 12, 2008

(86) PCT No.: PCT/IB2008/053253
§ 371 (c)(1),
(2), (4) Date: Feb. 12, 2010

(87) PCT Pub. No.: WO2009/022304
PCT Pub. Date: Feb. 19, 2009

(65) Prior Publication Data
US 2012/0127775 A1 May 24, 2012

(30) Foreign Application Priority Data

Aug. 15, 2007 (EP) .................................. 07114388
Aug. 13, 2008 (WO) .................. PCT/IB2008/053253

(51) Int. Cl.
*G06K 19/06* (2006.01)
(52) U.S. Cl.
USPC ........................................................ 235/492
(58) Field of Classification Search
USPC .............................. 235/492; 365/72; 327/427
See application file for complete search history.

(56) References Cited

U.S. PATENT DOCUMENTS

| 4,989,184 A | 1/1991 | Kishida et al. |
| 5,185,717 A | 2/1993 | Mori |
| 6,161,213 A | 12/2000 | Lofstrom |
| 6,836,430 B2 | 12/2004 | Wuidart et al. |
| 7,111,029 B2 | 9/2006 | Fujita et al. |
| 2003/0151539 A1 | 8/2003 | Wuidart et al. |
| 2005/0183047 A1 | 8/2005 | Sapiro |
| 2006/0038199 A1 | 2/2006 | Lee |
| 2006/0063286 A1 | 3/2006 | Bidermann et al. |
| 2006/0139990 A1 | 6/2006 | Candelier et al. |
| 2007/0138508 A1* | 6/2007 | Kim et al. ...................... 257/194 |

FOREIGN PATENT DOCUMENTS

| EP | 0506989 A1 | 10/1992 |
| EP | 0 860 881 A2 | 8/1998 |
| WO | 2004/102662 A1 | 11/2004 |

OTHER PUBLICATIONS

Tuinhout, H. et al. "Effects of Metal Coverage on MOSFET Matching", IEEE International Electron Devices Meeting, pp. 735-738 (1996).
Jaeger, R. C. et al. "Effects of Stress-Induced Mismatches on CMOS Analog Circuits", IEEE VLSI Technology, Systems, and Applications, pp. 354-360 (1995).
Ikeda. S et al. "The Impact of Mechanical Stress Control on VLSI Fabrication Process", International Electron Devices Meeting, p. 77-80 (1996).
Bastos, J. et al. "Influence of Die Attachment on MOS Transistor Matching", IEEE Transactions on Semiconductor Manufacturing, vol. 10, No. 2, p. 209-218 (May 1997).

* cited by examiner

*Primary Examiner* — Seung Lee

(57) ABSTRACT

The invention discloses an integrated circuit (10) for securely storing a codeword. The value of the codeword is dependent on the mobility ($\mu A$, $\mu B$, $\mu C$) of at least one transistor (TRA, TRB, TRC) of the integrated circuit. The invention further discloses a reader means (15), a method for determining the value of the codeword from the integrated circuit (10), and a method for altering the value of the codeword.

10 Claims, 3 Drawing Sheets

SECURE STORAGE OF A CODEWORD WITHIN AN INTEGRATED CIRCUIT

This invention relates to securely storing a codeword within an integrated circuit, and more particularly to securely storing a codeword that is defined by the physical characteristics of the integrated circuit.

The secure storage of codewords is very important for many applications that require secure data transactions, such as access permission, security clearance, finance, banking, and digital rights management as used in set top boxes and other forms of access to paid entertainment.

For example, a user may be provided with a credit card that has a secret codeword stored within it. The secret codeword may be sent along with a request for credit to a bank, the secret codeword indicating to the bank that the request for credit has truly originated from that particular credit card.

U.S. Pat. No. 6,836,430 discloses an integrated circuit having a plurality of transistors for storing a binary codeword that is permanently fixed by the physical characteristics of the integrated circuit.

However, techniques for obtaining un-authorised access to such codewords are becoming increasing sophisticated. Such techniques may involve extracting the die from its packaging and thinning the backside of the die, in order to gain close access to the physical circuits so that measurements to determine the secret codeword may be carried out.

It is, therefore, an object of the invention to improve on the known art.

According to a first aspect of the invention, there is provided an integrated circuit comprising a plurality of transistors that store a codeword, characterised in that the value of the codeword is determined by the mobility of at least a first transistor of the plurality of transistors.

Hence, an attempt to break open the packaging of the integrated circuit and to thin the backside of the die will typically result in the destruction of the secret codeword before it can be discovered. This is because the attempt to break open the packaging of the integrated circuit and to thin the backside of the die results in a change in the physical stress within the transistors, thereby forcing a change in the mobility of the transistors, and hence altering (destroying) the value of the secret codeword.

Additionally, the transistors may be arranged at a predetermined location of the die of the integrated circuit, the predetermined location being particularly susceptible to undergo physical stress compared to other areas of the die. For example, an edge or a corner of the die may be chosen as these locations are particularly likely to undergo physical stress when removing the die from a package, or when gripping the die, as may occur during an attempt to reverse engineer the circuit.

The plurality of transistors may form a circuit that is stable in two different states (bi-stable), and the mobilities of the transistors may bias the bi-stable towards one of the states. Therefore, the state that the bi-stable settles into when the bi-stable is powered up can be used to determine the codeword. For example, if a bi-stable has stable states of logic 0 and logic 1, and is biased towards logic 1 by the mobilities of its transistors, then the codeword that the bi-stable stores is logic 1.

The integrated circuit may comprise multiple bi-stables that are used to store the codeword, each bi-stable biased towards a particular one of its two stable states. For example, if an integrated circuit has two bi-stables, one biased towards logic 0 and the other biased towards logic 1, then the codeword that the bi-stables store is "01".

The use of the term codeword does not imply any particular format for the code, and other codewords may be defined dependent on which of the two states each of the bi-stables settle into. For example, the codeword may be a first long sequence of alphanumeric characters if two particular bi-stables both settle into stable states of logic 0, or a second long sequence of alphanumeric characters if one of the two bi-stables settles into a stable state of logic 0 and the other of the two bi-stables settles into a stable state of logic 1.

The designer of an integrated circuit typically works within the confines of the process technology, such as the maximum level of current that can be supplied to the circuit and/or tolerated by the circuit components. One important aspect that is under the control of the designer is the Width to Length (W/L) ratios of the transistors, and W/L ratios of greater than 1 are typically used as these usually give the best compromise between fast switching capabilities and low current consumption.

However, in contrast to common design practice, and in accordance with preferred embodiments of the invention, the W/L of the transistors may be set to a value of less than 1. This enables the transistors to be turned hard on (for example, operated with a high VGS-VT value) whilst staying within the maximum permitted current levels, to enhance the impact on the circuit of the mobility differences between the transistors.

Clearly, there is also scope for W/L ratios of greater than 1 to be used in other embodiments.

The codeword typically takes a random value according to random mobility variations that occur naturally at the time of the transistors' manufacture. Alternatively, the codeword may be set at a predetermined value during the manufacture of the integrated circuit, by applying a stress layer to alter the mobilities of the transistors and hence set the desired codeword. These stress layers may be used to set the values of specific parts of a codeword, for example, for identifying positions within the codeword, or for synchronisation purposes during serial readout of a complex codeword.

According to a second aspect of the invention, there is provided an apparatus comprising an integrated circuit according to the first aspect, and reader means for connecting to the integrated circuit and for reading the codeword, the reader means comprising driver means for driving the integrated circuit to determine the codeword.

According to a third aspect of the invention, there is provided a method for reading a codeword stored in an integrated circuit according to the first aspect, the method comprising driving the integrated circuit to determine a codeword according to the mobility of at least one of the transistors of the integrated circuit.

According to a fourth aspect of the invention, there is provided a method for altering the value of a codeword stored within an integrated circuit according to the first aspect, the method comprising applying physical stress to the die of the integrated circuit, thereby changing the mobility of the transistors on the die, and hence altering the value of the codeword.

Embodiments of the invention will now be described, by way of example only, and with reference to the accompanying drawings, in which.

Figure 1:
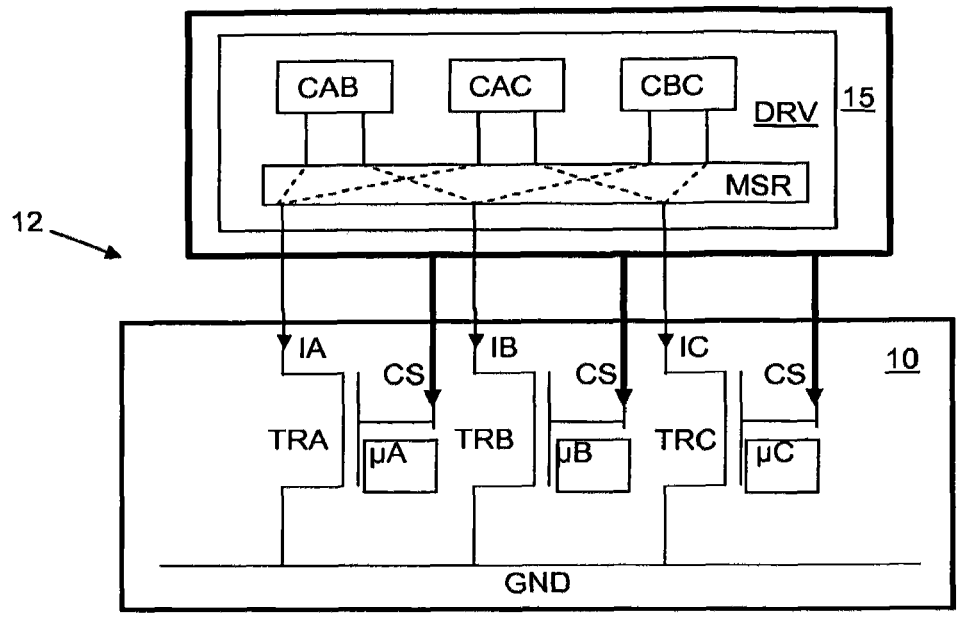
FIG. 1 shows an integrated circuit and a reader means according to a first embodiment.

Same or similar reference signs denote same or similar features. The Figures are not drawn to scale.

A first embodiment of the invention will now be described in relation to the apparatus 12 shown in FIG. 1. The apparatus 12 includes an integrated circuit 10, and a reader means 15. The integrated circuit 10 comprises a circuit having three transistors TRA, TRB, and TRC, and which have respective mobilities μA, μB, and μC. These mobilities will differ from one another due to the random occurrence of placement of dopant atoms, and other atomic scale deficiencies in the channel area of these devices, as will be appreciated by those skilled in the art. Therefore, the mobilities μA, μB, and μC store a random codeword whose value is not known at the time of the manufacture of the circuit.

The reader means 15 comprises a driver circuit DRV which includes a measuring circuit MSR and three comparator circuits CAB, CBC, and CAC for reading the codeword from the integrated circuit 10. The gate and drain terminals of the transistors TRA, TRB, and TRC are connected to the driver circuit DRV, and the source terminals of the transistors are connected to ground potential GND.

In use, the driver circuit DRV first applies a control signal CS to the gates of the transistors. The transistors have a threshold voltage (VT) of 2.5V, and the control signal CS has a voltage of 5V. Hence, the gate-source voltage (VGS) is 5V, and VGS−VT is 2.5V, thereby turning the transistors fully (hard) on. The levels of the currents IA, IB, and IC that then flow through the transistors will depend on the levels of the mobilities μA, μB, and μC respectively.

Next, the driver circuit measures the levels of the current IA, IB, and IC using the measuring circuit MSR, and determines the codeword according to the current levels using the comparators CAB, CBC, and CAC. Hence, the value of the codeword is determined by the mobilities μA, μB, and μC of the transistors TRA, TRB, and TRC.

An un-authorised attempt to gain close physical access to the transistors TRA, TRB, and TRC is likely to alter the physical stresses acting on the transistors TRA, TRB, and TRC, thereby causing a change in the mobilities μA, μB, and μC, and hence destroying the codeword before direct measurements can be made of the transistors.

In the first embodiment, the codeword is determined by comparing the currents IA, IB, and IC to one another. More specifically, the three comparators CAB, CAC, and CBC compare IA to IB, IA to IC, and IB to IC respectively. The output of each comparator is a logic 1 or a logic 0 depending on which of the two compared currents is the highest. Therefore, the codeword is made up of three logical bits, one bit for the output of each comparator.

Of course, many other methods of deriving a codeword from the levels of the three currents IA, IB, and IC may easily be conceived by those skilled in the art. For example, the levels of the currents may be measured and compared to threshold levels in order to determine a codeword, or the levels of currents may be converted into digital values using an analogue to digital converter and then combined to derive a codeword.

Alternatively, the three currents may be used to determine three respective codewords. For example, the current IA may be compared to a reference current level of the reader, and the codeword may be a "1" if the current IA is higher than the reference current level, or may be a "0" if the current IA is lower than the reference current level.

In the first embodiment, the transistors TRA, TRB, and TRC have a W/L ratio of less than 1, in order to enable a high VGS-VT value, to make differences in mobility between the transistors most apparent. For the avoidance of doubt, it is stated that VGS is the gate-source voltage of a transistor, VT is the threshold voltage of the transistor, and the larger the VGS-VT value, the harder the transistor is turned on.

The transistors TRA, TRB, and TRC used in the first embodiment are MOSFET transistors. However, other types of transistor such as bipolar transistors may alternatively be used.

As an alternative to the first embodiment, the driver circuit DRV may be implemented within the integrated circuit 10, instead of within a separate reader means 15. Then, the value of the secret codeword can be utilised by an additional circuit of the integrated circuit 10, such as a cryptographic circuit for encrypting/decrypting data during a data exchange with an external device.

Figure 2:
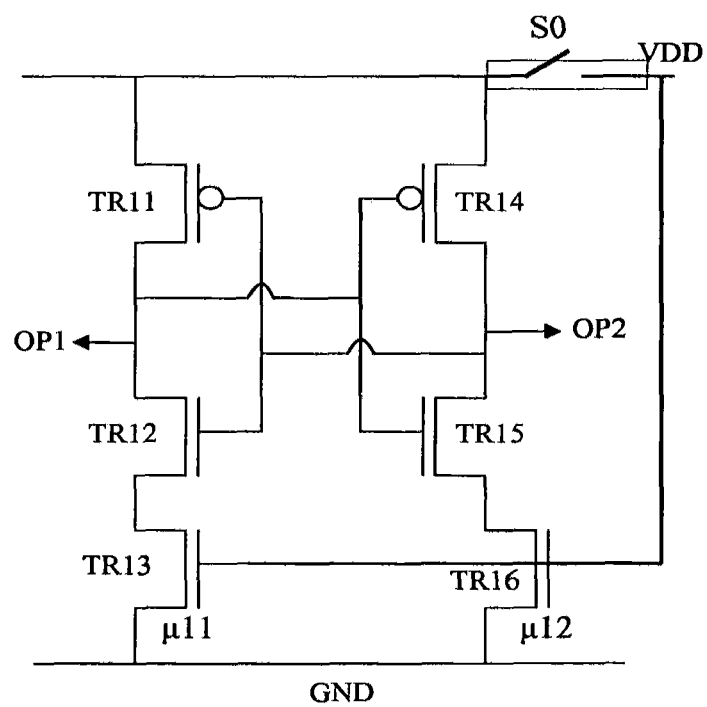
FIG. 2 shows a diagram of a circuit in an integrated circuit according to a second embodiment.

FIG. 2 shows a diagram of a bi-stable latch circuit in an integrated circuit according to a second embodiment of the invention. The bi-stable latch circuit has outputs OP1 and OP2, and the two stable states of the bi-stable latch are OP1=logic 1 and OP2=logic 0, or OP1=logic 0 and OP2=logic 1, as will be apparent to those skilled in the art.

The latch circuit comprises six transistors TR11, TR12, TR13, TR14, TR15, and TR16, and a switch S0. The mobilities of the transistors differ from each other due to the random occurrence of the placement of dopant atoms, and other atomic scale deficiencies in the channel area of these devices that occur at the time of manufacture. The transistors TR13 and TR16 have mobilities of μ11 and μ12 respectively and W/L values of less than 1.

The transistors TR11, TR12, TR13 form a first branch of series connected transistors, and the transistors TR14, TR15, TR16 form a second branch of series connected transistors. An output node OP1 of the first branch is connected to an input node (gates of TR14 and TR15) of the second branch, and an output node OP2 of the second branch is connected to an input node (gates of TR11 and TR12) of the first branch, thereby forming the latch (bi-stable).

When a supply voltage VDD is applied to the circuit with the switch S0 open, the transistors TR13 and TR16 are both are turned fully on (i.e. their gate voltages are much higher than their threshold voltages), and so the difference in mobility between the transistors TR13 and TR16 causes a difference in their conductivities. The high gate voltages will cause the mobility differences to dominate over other types of variations that can cause also conductivity differences, such as threshold voltage variations.

Then, when the switch S0 is closed, current flows through TR11, TR12, TR14, and TR15, and the latch circuit will tend settle in the stable state of either OP1=logic 1 and OP2=logic 0, or OP1=logic 0 and OP2=logic 1, depending on the difference in conductivity between TR13 and TR16.

The logic state that the latch settles to on closing the switch S0 is very reproducible, is randomly determined by the manufacturing process, and is therefore unknown to even the manufacturer. A set of, for example, 128 of these latches can produce a 128 bit codeword (encryption key) for encryption purposes. Since the codeword is based on the difference in mobility between the transistors of the latches, the codeword is very easily corrupted by an attempt to reverse engineer the circuit for the purpose of determining the codeword.

The use of the switch S0 ensures that the transistors TR13 and TR16 immediately start conducting different levels of current when the latch circuit is powered up, which helps ensure that the latch circuit settles into the same stable state every time the switch S0 is closed. Alternatively, the switch S0 may be omitted, in which case the latch is powered up by raising the voltage level VDD of the power supply.

In the second embodiment, the mobilities of the transistors of the latch circuit take random values at the time of manufacturing, although, alternatively, the mobilities of one or more of the transistors may be purposefully altered by applying a stress layer to the one or more transistors. The purposeful modification of the mobility can cause the latch to settle into a predetermined state, and therefore enable the storage of a predetermined codeword. For example, if the mobility $\mu12$ of the transistor TR16 is set at a higher level than the mobility $\mu11$ of transistor TR13, then the conductivity of TR16 will be higher than that of TR13, and so when the switch S0 is closed the latch will tend to settle in the stable state of OP1=logic 1 and OP2=logic 0, instead of the other stable state of OP1=logic 0 and OP2=logic 1.

The value of the codeword in this case is determined according to which of the two states the latch settles into. For example, if OP1=1 and OP2=0, then the codeword may be "10", and if OP1=0 and OP2=1, then the codeword may be "01".

The integrated circuit of the second embodiment may be driven by a driver circuit of an external device, in a similar arrangement to that shown in FIG. 1 where the integrated circuit of the first embodiment is driven by a driver DRV of a reader means 15. For example, the integrated circuit of the second embodiment may be embedded within a credit card, and a credit card reader may comprise a driver circuit for driving the integrated circuit of the second embodiment. The driver circuit for driving the integrated circuit of the second first applies the voltages VDD and GND to the circuit of FIG. 2, then applies a control voltage to close the switch S0, and then reads the states that the latches settle into in order to determine the codeword.

The first and second embodiments have described implementations where the transistor mobilities and hence the codeword have been set at random according to natural variations in the manufacturing process. A methodology for purposefully and controllably influencing the mobilities of the transistors, to enable storage of a predetermined codeword, will now be described with reference to FIG. 3.

Figure 3:
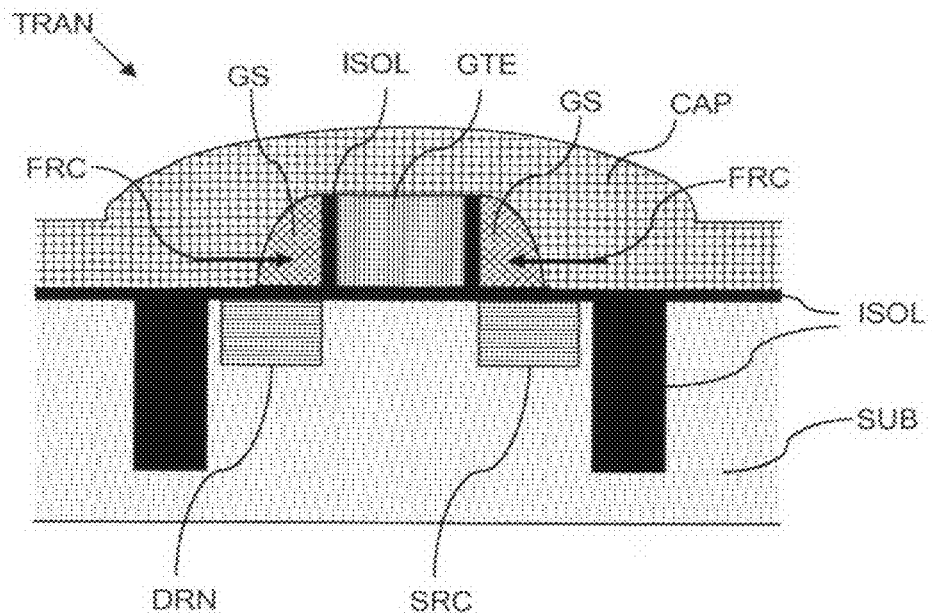
FIG. 3 shows a schematic diagram of a transistor having a stress layer that modifies the stress within the transistor.

FIG. 3 shows a schematic cross-sectional diagram of a transistor TRAN which is formed on a substrate SUB, and which may be used to implement one or more of the transistors TRA, TRB, TRC, TR11, TR12, TR13, TR14, TR15, TR16. The transistor TRAN is a MOS transistor, and comprises a gate electrode GTE, a source electrode SRC, and a drain electrode DRN. The electrodes are isolated by an oxide layer ISOL and a two gate spacers GS. The oxide layer ISOL fills two trenches in the substrate that form the Shallow Trench Isolation for isolating the source-drain channel of the transistor from any other nearby transistors.

The transistor TRAN has a capping layer (stress layer) CAP, which modifies the stress within the transistor TRAN, thereby modifying the transistor's mobility. For example, FIG. 3 shows forces FRC that act to compress the gate region of the transistor, thereby influencing the mobility. The forces FRC are primarily due to a difference in the thermal expansion coefficients of the capping layer CAP and the substrate SUB.

The thermal expansion coefficients of the capping layer CAP and the other various layers of the transistor will differ according to their compositions, and hence their compositions can be controlled to set the stress within the transistor.

Both compressive stress and tensile stress can be applied to the transistor, and changes in mobility of between 30 and 70% have been reported.

The capping layer CAP may extend over multiple transistors, and may have different compositions in different regions in order to apply different stresses to the transistors beneath it.

Tensile stress tends to increase mobility in NMOS transistors and decrease mobility in PMOS transistors, whereas compressive stress tends to increase mobility in PMOS transistors and decrease mobility in NMOS transistors. For a further description of how stress affects transistor mobility, the reader is referred to U.S. Pat. No. 7,023,018.

The use of a capping layer to influence mobility is particularly advantageous, since any damage that occurs to the capping layer during an unauthorised attempt to extract the codeword is likely to alter the mobilities of the transistors, and therefore destroy the codeword before it can be discovered.

Aside from the application of a capping layer, there are many other stress modifying mechanisms that are known to those skilled in the art. For example, metal layers used for electrically connecting MOS transistors together are soft and cause tensile stress, and moulded plastic encapsulation used for packaging the circuit shrinks after cooling and causes compressive stress. The Shallow Trench Isolation can also generate stress. However, these stresses originate further away from the gate region of the transistor than the stresses due to the capping layer, and so the stresses due to the capping layer dominate. Hence, use of capping to set the stress within the transistor is preferred. The mobility of the transistors may also be controlled by forming the transistors at an angle to the lattice direction of the substrate.

Figure 4:
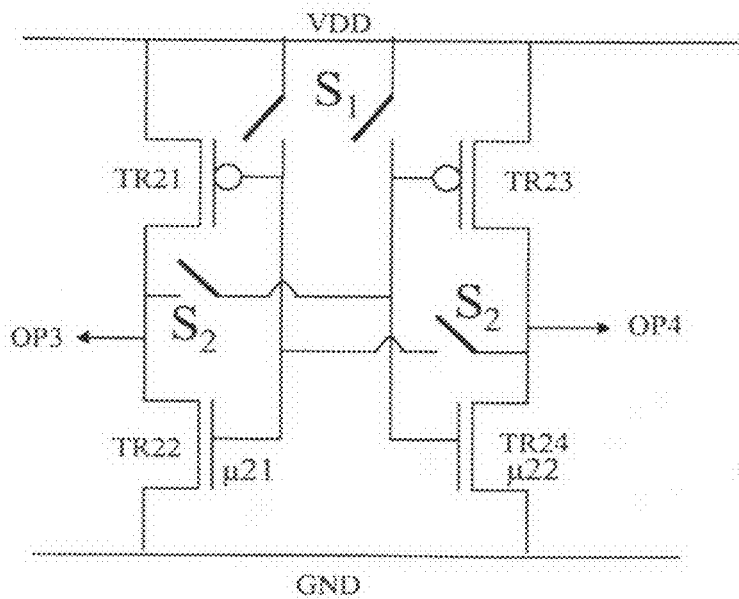
FIG. 4 shows a diagram of a circuit in an integrated circuit according to a third embodiment.

A third embodiment of the invention will now be described with reference to FIGS. 4 and 5. FIG. 4 shows a circuit diagram of a latch circuit (bi-stable) that is implemented four times within the integrated circuit 40 shown in FIG. 5. The latch circuit comprises four transistors TR21, TR22, TR23, and TR24, and two sets of switches S1 and S2 for controlling when power is applied to the various parts of the latch.

Figure 5:
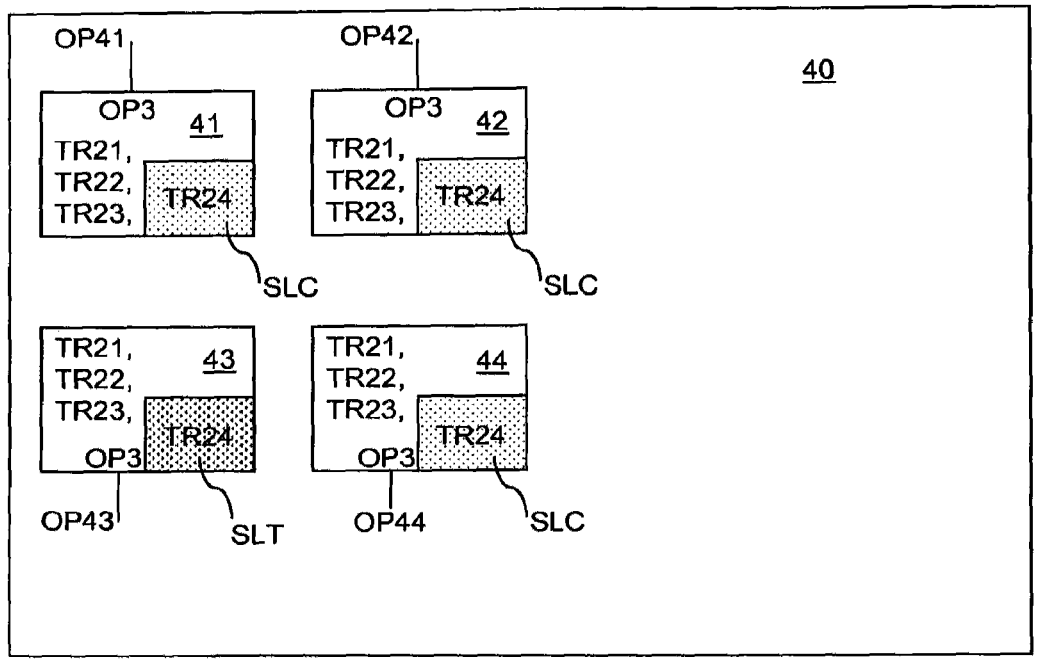
FIG. 5 shows an integrated circuit according to the third embodiment, the integrated circuit comprising four of the circuits shown in FIG. 4.

The latch circuits 41, 42, 43, and 44 are implemented at the corner of the integrated circuit 40 (much closer to the corner than can be clearly shown in FIG. 5)

The transistors TR21, TR22 form a first branch of series connected transistors, and the transistors TR23, TR24 form a second branch of series connected transistors. An output node OP3 of the first branch is connectable via a first switch of the switches S2 to an input node (gates of TR23 and TR24) of the second branch, and an output node OP4 of the second branch is connectable via a second switch of the switches S2 to an input node (gates of TR11 and TR12) of the first branch, thereby forming the latch (bi-stable).

To operate the latch, firstly, sets of switches S1 and S2 are both opened. Then, switches S1 are closed to turn TR22 and TR24 fully on, and the difference in mobility between TR22 and TR24 means that one of the outputs OP3 and OP4 is pulled closer to ground potential than the other of the outputs OP3 and OP4. Then, the switches S1 are opened and the switches S2 are closed, applying feedback between the two series branches of the latch. This causes the latch to flip into either the stable state of OP3=logic 1 and OP4=logic 0, or the stable state of OP3=logic 0 and OP4=logic 1, dependent on which of the two outputs was pulled closer to ground potential whilst switches S1 were closed.

The integrated circuit 40 comprises four circuits 41, 42, 43, and 44 according to the circuit diagram of FIG. 4. Within the circuits 41, 42, and 44, the mobilities $\mu22$ of transistors TR24 have been modified by a compressive stress layer SLC. Therefore, the transistors TR24 of circuits 41, 42, and 44 have a lower mobility than the transistors TR22 of circuits 41, 42, and 44, thereby biasing the circuits 41, 42, and 44 towards the stable state of OP3=1 and OP4=0. Within the circuit 43, the mobility µ22 of transistor TR24 has been modified by a tensile stress layer SLT. Therefore, the transistor TR24 of circuit 43 has a higher mobility than the transistor TR22 of circuit 43, thereby biasing the circuit 43 towards the stable state of OP3=0 and OP4=1. The stress layers SLC and SLT are formed by controlling the composition of a capping layer CAP, as described earlier in relation to FIG. 3.

In the third embodiment, a stress layer is applied over transistor TR24 only, however, a stress layer may also be applied to one or more of TR21, TR22, or TR23. For example, the transistors TR21 and TR22 of circuits 41, 42, and 43 may have a compressive stress layer applied to them, and the transistors TR23 and TR24 of circuits 41, 42, and 43 both have a tensile stress layer applied to them. This increases the mobilities of transistors TR21 and TR24, and decreases the mobilities of TR22 and TR23, thereby further improving the degree of biasing of circuits 41, 42, and 43 towards the stable state of OP3=1 and OP4=0.

The latch circuit is manufactured using a standard CMOS manufacturing process, and typically does not require any additional processing steps, therefore enabling low cost manufacturing. The transistors TR21 and TR23 are PMOST devices, and the transistors TR22 and TR24 are NMOST devices.

The integrated circuit 40 can be connected to a reader means (not shown in the drawings) that comprises a driver means, in a similar arrangement to that shown in FIG. 1. The driver means can drive the power supply terminals VDD and GND, and the switches S1 and S2, and receive the outputs OP41, OP42, OP43, and OP44 in order to determine the codeword. For example, the integrated circuit 40 may be embedded within a personal ID (Identification) card, and an ID card reader may comprise the driver circuit for driving the integrated circuit.

The integrated circuit 40 of the ID card may comprise a wireless transceiver so that it can connect to the driver circuit of the ID card reader wirelessly. Then, the wireless transceiver may receive instructions from the driver circuit using a wireless protocol such as Near Field Communication (NFC). The wireless transceiver may apply voltages to the latch circuits 41, 42, 43, and 44 according to the instructions, and then wirelessly transmit the states of the latches and/or the codeword back to the driver circuit.

The outputs OP41, OP42, OP43, and OP44 can be used to determine a single codeword, or multiple codewords. For example, one codeword may be based on the outputs OP41, OP42, and OP43, and another codeword based on the outputs OP42 and OP44. Clearly, if a higher number of the circuits of FIG. 4 are implemented for storing a codeword within the integrated circuit 40, then a higher number of codeword combinations become available, and the likelihood of the codeword becoming corrupted during an attempt to gain close physical access to the circuits increases.

A fourth embodiment of the invention will now be described with reference to FIG. 6, which shows an alternative circuit to that of FIG. 2 and FIG. 4.

Figure 6:
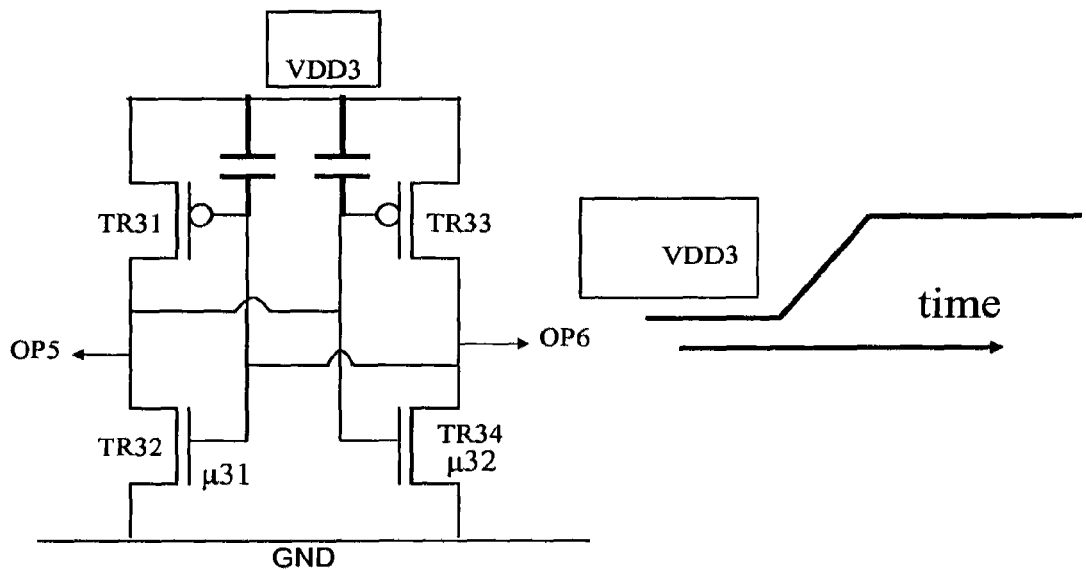
FIG. 6 shows a diagram of a circuit in an integrated circuit according to a fourth embodiment.

The bi-stable latch circuit shown in FIG. 6 comprises two capacitors which are connected between a power supply VDD3 and latch feedback connections. The latch feedback connections connect a first series branch formed by transistors TR31 and TR32 to a second series branch formed by transistors TR33 and TR34. The transistor TR34 has a mobility µ32 which is higher than the mobility µ31 of the transistor TR32, in order to bias the latch towards the state OP5=logic 1 and OP6=logic 0

As shown in FIG. 6, the latch is driven by a power supply voltage VDD3 that is ramped up over time. Due to the capacitors, the gates of the transistors will be pulled up during the ramping up of VDD3, and so the transistors TR32 and TR34 will be fully turned on. Since TR34 has a higher mobility than TR32, the output OP6 is pulled closer to ground potential than the output OP5, and so the latch flips into the state OP5=logic 1 and OP6=logic 0.

From reading the present disclosure, other variations and modifications will be apparent to the skilled person. Such variations and modifications may involve equivalent and other features which are already known in the art, and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub-combination.

The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, and reference signs in the claims shall not be construed as limiting the scope of the claims.

The invention claimed is:

1. An integrated circuit comprising a plurality of transistors that store a codeword determined by a difference in mobility between a first transistor and a further transistor of the plurality of transistors, wherein the plurality of transistors are arranged to form a bi-stable circuit having two stable states; and wherein the difference in mobility between the first transistor and the further transistor biases the bi-stable circuit towards one or the other of the stable states to determine the codeword.

2. The integrated circuit of claim 1, wherein the plurality of transistors comprise a first branch of series connected transistors comprising the first transistor, and a second branch of series connected transistors comprising the further transistor; wherein an output node of the first branch is connected to an input node of the second branch, and wherein an output node of the second branch is connected to an input node of the first branch, thereby forming the bi-stable circuit.

3. The integrated circuit of claim 1, comprising a plurality of the bi-stable circuits.

4. The integrated circuit of claim 1, wherein at least the first transistor has a width to length ratio of less than one.

5. The integrated circuit of claim 1, wherein at least the first transistor is located at a predetermined location of the die of the integrated circuit, the predetermined location being more susceptible to undergo physical stress than other areas of the die.

6. The integrated circuit of claim 5, wherein the predetermined location is at a corner or an edge of the die of the integrated circuit.

7. The integrated circuit of claim 1 wherein a stress layer (CAP) is provided to influence the stress within the transistors, thereby controlling the mobilities of the transistors and hence the value of the codeword.

8. The integrated circuit of claim 7, wherein the stress layer comprises a compressive stress layer and a tensile stress layer, the compressive stress layer setting a first level of mobility and the tensile stress layer setting a second level of mobility.

9. Apparatus comprising the integrated circuit of claim 1 and a reader for connecting to the integrated circuit and reading the codeword, the reader comprising a driver for driving the integrated circuit to determine the codeword.

10. A method for reading a codeword stored in an integrated circuit according to claim 1, the method comprising driving the integrated circuit to determine a codeword, the codeword being determined by the difference in mobility between the first transistor and a further transistor of a bi-stable circuit of the integrated circuit.

* * * * *